United States Patent
Pautsch et al.

(10) Patent No.: US 8,120,915 B2
(45) Date of Patent: Feb. 21, 2012

(54) INTEGRAL HEAT SINK WITH SPIRAL MANIFOLDS

(75) Inventors: Adam Gregory Pautsch, Rexford, NY (US); Satish Sivarama Gunturi, Albany, NY (US); Patrick Jose Lazatin, Glenville, NY (US)

(73) Assignee: General Electric Company, Niskayuna, NY (US)

( * ) Notice: Subject to any disclaimer, the term of this patent is extended or adjusted under 35 U.S.C. 154(b) by 0 days.

(21) Appl. No.: 12/861,181

(22) Filed: Aug. 23, 2010

(65) Prior Publication Data

US 2010/0315782 A1    Dec. 16, 2010

Related U.S. Application Data

(63) Continuation-in-part of application No. 12/193,441, filed on Aug. 18, 2008, now Pat. No. 7,817,422.

(51) Int. Cl.
*H05K 7/20* (2006.01)

(52) U.S. Cl. ...... 361/699; 257/714; 174/15.1; 165/80.4; 165/104.33

(58) Field of Classification Search .................. None
See application file for complete search history.

(56) References Cited

U.S. PATENT DOCUMENTS

| | | | |
|---|---|---|---|
| 4,010,489 A | | 3/1977 | Bourbeau et al. |
| 4,029,141 A | | 6/1977 | Ferrari et al. |
| 4,313,128 A | | 1/1982 | Schlegel et al. |
| 4,392,153 A | * | 7/1983 | Glascock et al. ............ 257/746 |
| 4,559,580 A | | 12/1985 | Lutfy |
| 4,614,227 A | | 9/1986 | Vogel |
| 4,838,041 A | * | 6/1989 | Bellows et al. ............... 62/51.2 |
| 5,006,921 A | | 4/1991 | Ishizuka et al. |
| 5,186,238 A | * | 2/1993 | del Puerto et al. ........... 165/80.4 |
| 5,221,851 A | | 6/1993 | Gobrecht et al. |
| 5,423,376 A | | 6/1995 | Julien et al. |
| 5,495,889 A | * | 3/1996 | Dubelloy ................. 165/104.33 |

(Continued)

FOREIGN PATENT DOCUMENTS

EP    0989611 B1    3/2000

(Continued)

OTHER PUBLICATIONS

R. S. Zhang et al., "Advanced and Integrated Cooling for Press-Packages," U.S. Appl. No. 12/193,429, filed Aug. 18, 2008, GE Docket No. 205337-1.

(Continued)

*Primary Examiner* — Boris Chervinsky
(74) *Attorney, Agent, or Firm* — Penny A. Clarke (57) ABSTRACT

A heat sink is provided for directly cooling at least one electronic device package having an upper contact surface and a lower contact surface. The heat sink comprises a cooling piece formed of at least one thermally conductive material, where the cooling piece defines at least one inlet manifold configured to receive a coolant and at least one outlet manifolds configured to exhaust the coolant. The inlet and outlet manifolds are interleaved and are disposed in a spiral arrangement. The cooling piece further defines a number of millichannels disposed in a radial arrangement and configured to receive the coolant from the inlet manifolds and to deliver the coolant to the outlet manifolds. The millichannels and inlet and outlet manifolds are further configured to directly cool one of the upper and lower contact surface of the electronic device package by direct contact with the coolant, such that the heat sink comprises an integral heat sink.

12 Claims, 5 Drawing Sheets

U.S. PATENT DOCUMENTS

| | | | |
|---|---|---|---|
| 5,705,853 | A | 1/1998 | Faller et al. |
| 5,727,618 | A | 3/1998 | Mundinger et al. |
| 5,978,220 | A | 11/1999 | Frey et al. |
| 6,014,312 | A | 1/2000 | Schulz-Harder et al. |
| 6,152,215 | A * | 11/2000 | Niggemann .................. 165/166 |
| 6,388,317 | B1 | 5/2002 | Reese |
| 6,473,303 | B2 | 10/2002 | Kaufmann |
| 6,738,258 | B2 | 5/2004 | Bijlenga et al. |
| 6,921,969 | B2 | 7/2005 | Knapp |
| 7,061,104 | B2 | 6/2006 | Kenny, Jr. et al. |
| 7,139,172 | B2 | 11/2006 | Bezama et al. |
| 7,156,159 | B2 | 1/2007 | Lovette et al. |
| 7,185,697 | B2 | 3/2007 | Goodson et al. |
| 7,327,024 | B2 | 2/2008 | Stevanovic et al. |
| 7,331,378 | B2 | 2/2008 | Bhatti et al. |
| 7,353,859 | B2 | 4/2008 | Stevanovic et al. |
| 7,414,843 | B2 | 8/2008 | Joshi et al. |
| 7,460,369 | B1 | 12/2008 | Blish, II |
| 7,569,426 | B2 | 8/2009 | Myers et al. |
| 7,817,422 | B2 * | 10/2010 | Gunturi et al. ................ 361/699 |
| 2004/0190251 | A1 | 9/2004 | Prasher et al. |
| 2006/0144565 | A1 | 7/2006 | Tsai et al. |
| 2007/0215325 | A1 | 9/2007 | Solovitz et al. |
| 2007/0295482 | A1 | 12/2007 | Fitzgerald et al. |
| 2010/0038058 | A1 | 2/2010 | Gunturi et al. |

FOREIGN PATENT DOCUMENTS

| | | |
|---|---|---|
| WO | 0195688 A1 | 12/2001 |
| WO | 02097883 A1 | 12/2002 |

OTHER PUBLICATIONS

EP 09176561 Search Report, Mar. 29, 2010.
"Semiconductor Cooler," Anonymous, Mason Publications, ISSN: 0374-4353, vol. 324, No. 40, Apr. 1, 1991.
Office Action, U.S. Appl. No. 12/193,429, May 3, 2010.

* cited by examiner

INTEGRAL HEAT SINK WITH SPIRAL MANIFOLDS

CROSS REFERENCE TO RELATED APPLICATIONS

This application is a continuation in part of U.S. patent application Ser. No. 12/193,441, Satish Gunturi et al., entitled "Heat sink and cooling and packaging stack for press-packages," which patent application is incorporated by reference herein in its entirety.

BACKGROUND

The invention relates generally to power electronics and, more particularly, to advanced cooling for power electronics.

High power converters, such as medium voltage industrial drives, frequency converters for oil and gas, traction drives, Flexible AC Transmission (FACT) devices, and other high power conversion equipment, for example rectifiers and inverters, typically include press-pack power devices with liquid cooling. Non-limiting examples of power devices include integrated gate commutated thyristors (IGCTs), diodes, insulated gate bipolar transistors (IGBTs), thyristors and gate turn-off thyristors (GTOs). Press-pack devices are particularly advantageous in high power applications, and benefits of press-packs include double-sided cooling, as well as the absence of a plasma explosion event during failure.

To construct a high power converter circuit using press-pack devices, heat sinks and press-pack devices are typically sandwiched to form a stack. State-of-the-art power converter stacks typically employ conventional liquid cooled heat sinks with larger diameter cooling channels. In certain applications, thermal grease layers are disposed between respective ones of the press-pack device and the conventional liquid cooled heat sink. In other applications, at least some of the layers are simply held together by pressure, with no thermal grease in between them. This arrangement results in significant thermal contact resistance. This arrangement results in significant contact resistance. Other shortcomings of such power converter stacks include relatively high thermal impedance from the semiconductor junction to the liquid, as well as a relatively complex stack assembly structure and process due to the number of parts involved.

Accordingly, it would be desirable to improve the thermal performance and packaging of power converter stacks using press-pack devices. More particularly, it would be desirable to reduce the thermal impedance from the semiconductor junction to the liquid for high reliability and/or high power density. It would further be desirable to provide a relatively simplified stack assembly structure for high maintainability.

BRIEF DESCRIPTION

One aspect of the present invention resides in a heat sink for directly cooling at least one electronic device package having an upper contact surface and a lower contact surface. The heat sink comprises a cooling piece formed of at least one thermally conductive material, where the cooling piece defines at least one inlet manifold configured to receive a coolant and at least one outlet manifold configured to exhaust the coolant. The inlet and outlet manifolds are interleaved and are disposed in a spiral arrangement. The cooling piece further defines a number of millichannels disposed in a radial arrangement and configured to receive the coolant from the inlet manifold and to deliver the coolant to the outlet manifold. The millichannels and inlet and outlet manifolds are further configured to directly cool one of the upper and lower contact surface of the electronic device package by direct contact with the coolant, such that the heat sink comprises an integral heat sink.

DRAWINGS

These and other features, aspects, and advantages of the present invention will become better understood when the following detailed description is read with reference to the accompanying drawings in which like characters represent like parts throughout the drawings, wherein.

Although the above-identified drawing figures set forth alternative embodiments, other embodiments of the present invention are also contemplated, as noted in the discussion. In all cases, this disclosure presents illustrated embodiments of the present invention by way of representation and not limitation. Numerous other modifications and embodiments can be devised by those skilled in the art which fall within the scope and spirit of the principles of this invention.

DETAILED DESCRIPTION

A heat sink 10 for directly cooling at least one electronic device package 20 is described with reference to FIGS. 1-10. As indicated for example in FIG. 1, an exemplary electronic device package has an upper contact surface 22 and a lower contact surface 24. The heat sink comprises a cooling piece 16 formed of at least one thermally conductive material. As indicated, for example, in FIGS. 2 and 3, the cooling piece 16 defines at least one inlet manifold 30 configured to receive a coolant and at least one outlet manifold 32 configured to exhaust the coolant. As indicated, for example, in FIGS. 2 and 3, the inlet and outlet manifolds 30, 32 are interleaved and are disposed in a spiral arrangement. As indicated, for example, in FIGS. 2 and 3, the cooling piece 16 further defines a number of millichannels 34 disposed in a radial arrangement and configured to receive the coolant from the inlet manifold (s) 30 and to deliver the coolant to the outlet manifold(s) 32. The millichannels 34 and inlet and outlet manifolds 30, 32 are further configured to directly cool one of the upper and lower contact surface 22, 24 of the electronic device package 20 by direct contact with the coolant, such that the heat sink 10 comprises an integral heat sink 10. More particularly, the manifolds 30, 32 and millichannels 34 are disposed proximate to the respective one of the upper and lower contact surfaces 22, 24 for cooling the respective surface by direct contact with the coolant. According to more particular embodiments, the inlet and outlet manifolds 30, 32 and millichannels 34 are configured to deliver the coolant uniformly to the respective one of the upper and lower contact surface 22, 24 of the electronic device package 20 being cooled.

Thus, the heat sink 10 is integral to the electronic device package 20, in that the heat sink 10 cools the electronic device package 20 by direct contact with the coolant. In other words, the millichannels 34 and inlet and outlet manifolds 30, 32 of integral heat sink 10 are open on the side facing the power device package 20, such that the coolant flowing through the millichannels 34 can directly contact the power device package 20. This arrangement is a distinct improvement over the self-contained heat sinks of the prior art, in which the coolant is contained within the heat sink and must thus cool the devices indirectly through the heat sink case. By eliminating these additional thermal layers, the integral heat sink 10 of the present invention provides enhanced cooling of the power devices.

The cooling piece 16 can be formed using a variety of thermally conductive materials, non-limiting examples of which include copper, aluminum, nickel, molybdenum, titanium, copper alloys, nickel alloys, molybdenum alloys, titanium alloys, aluminum silicon carbide (AlSiC), aluminum graphite and silicon nitride ceramic. The cooling piece 16 can be cast and/or machined. For example, the cooling piece 16 can be cast and then machined to further define fine features and surface requirements.

Non-limiting examples of the coolant include de-ionized water and other non-electrically conductive liquids.

For particular embodiments, the manifolds 30, 32 have relatively larger diameters than the radial millichannels 34. In one non-limiting example, the width of the millichannels is in a range of about 0.5 mm to about 2.0 mm, and the depth of the millichannels is in a range of about 0.5 mm to about 2 mm. In particular, the thickness of the channels may be determined to ensure pressure uniformity on the semiconductor. By making the pressure distribution on the semiconductor more uniform, the performance of the semiconductor is not compromised. Further, it should be noted that the radial millichannels 34 and the manifolds 30, 32 could have a variety of cross-sectional shapes, including but not limited to, rounded, circular, trapezoidal, triangular, and square/rectangular cross sections. The channel shape is selected based on the application and manufacturing constraints and affects the applicable manufacturing methods, as well as coolant flow. Beneficially, the incorporation of radial millichannels 34 into the heat sink 10 significantly increases the surface area of heat conduction from the semiconductor device 20 to the coolant.

In the illustrated arrangements, the inlet and outlet manifolds 30, 32 are disposed in a spiral arrangement. As used herein, the phrase "spiral arrangement" should be understood to encompass manifolds that deviate from the perfect spirals shown in the illustrated examples. For example, the manifolds may possess additional curvature. For the example spiral arrangement shown in FIGS. 2 and 3, the inlet and outlet manifolds 30, 32 are spirals, which turn the same way but are 180 degrees out of phase. Beneficially, this spiral arrangement reduces the number of machining steps needed to form the manifolds dramatically (for example, only two machining steps are needed for the arrangement of FIGS. 2 and 3).

Figure 2:
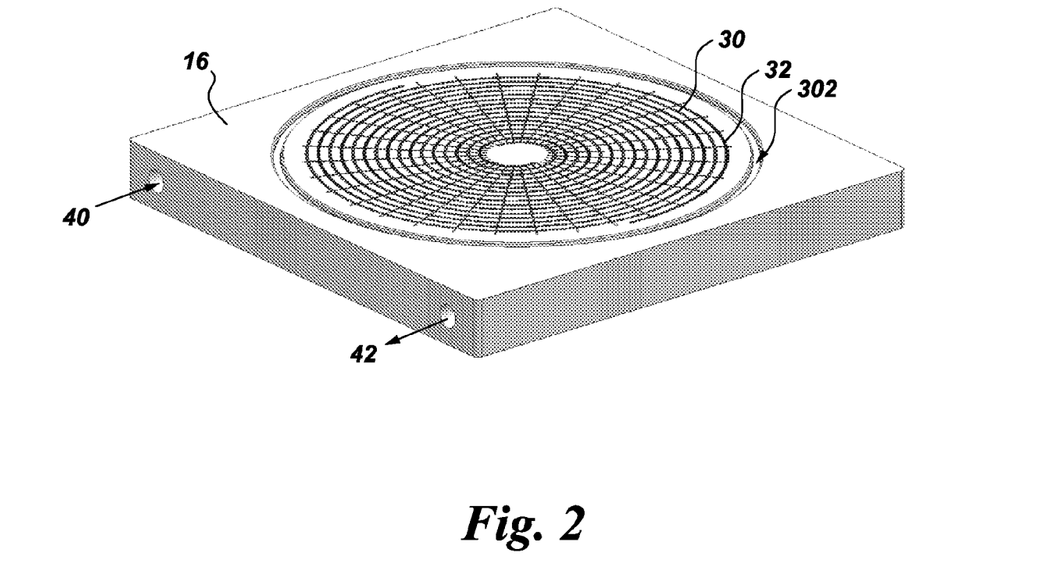
FIG. 2 is a perspective view of a heat sink body with radial millichannels and spiral manifolds incorporated into a single cooling piece.
Figure 3:
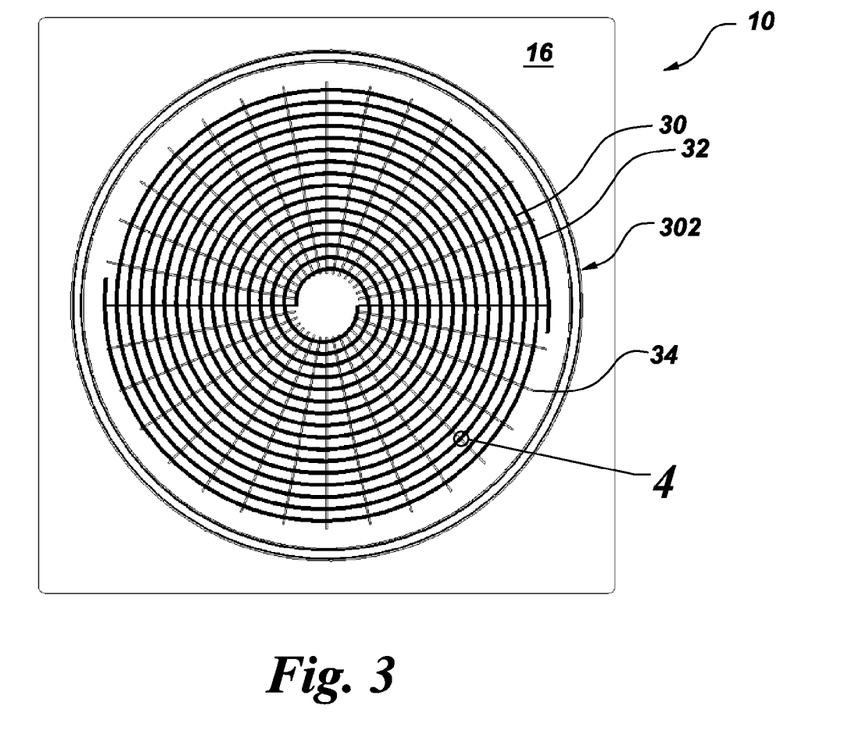
FIG. 3 is a top view of the heat sink shown in FIG. 3.
Figure 7:
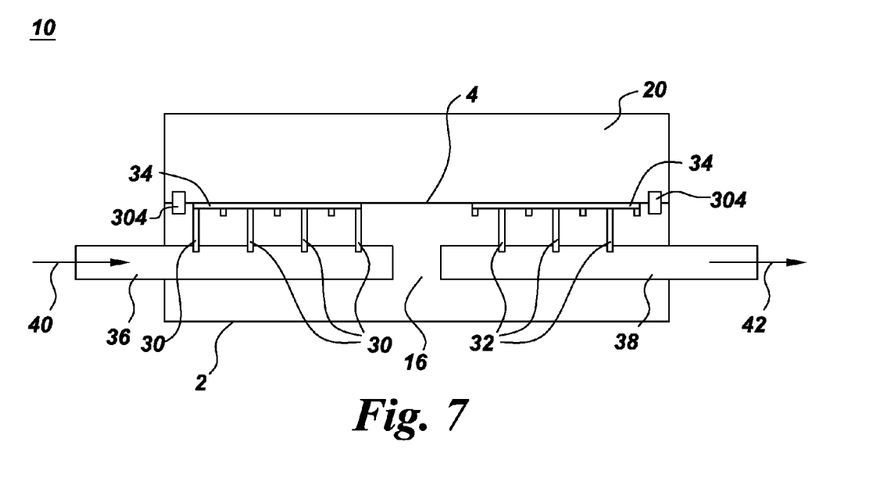
FIG. 7 is a cross-sectional view of a single sided heat sink.
Figure 8:
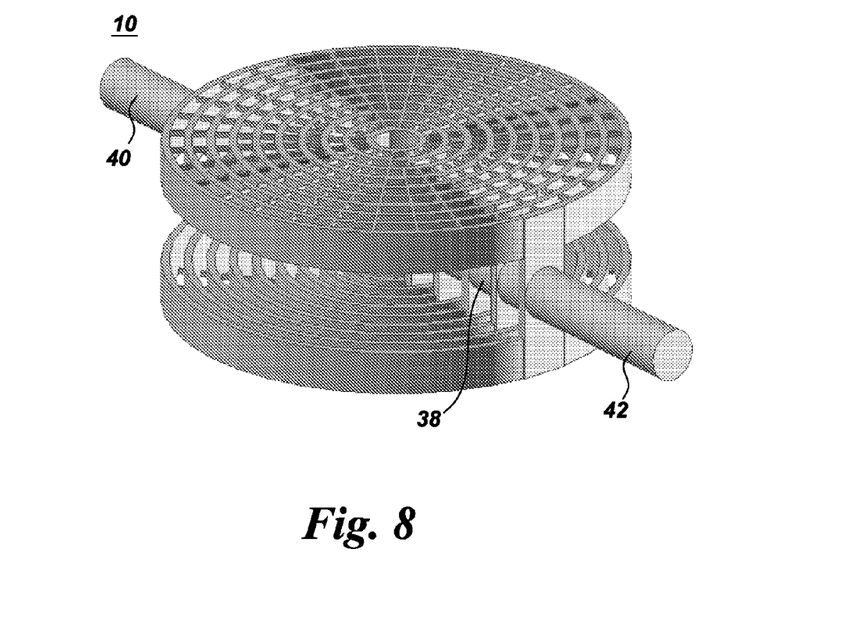
FIG. 8 is an inverse model of a double sided heat sink with circular manifolds and inlet distribution and outlet chambers that are arranged linearly relative to the respective inlet and outlet plena.
Figure 10:
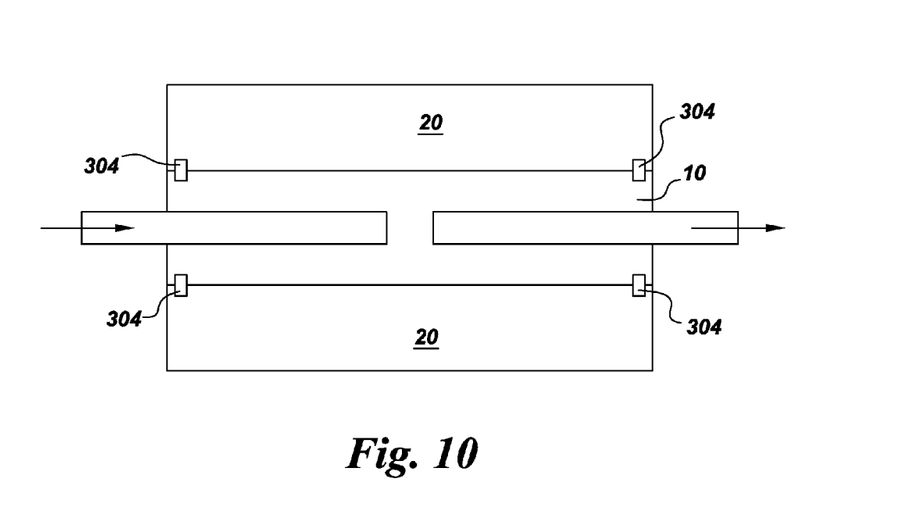
FIG. 10 schematically depicts a double sided heat sink sealed to neighboring electronic packages with gaskets.

For the example arrangements shown in FIGS. 2 and 3, cooling piece 16 further defines a groove 302 for receiving a gasket 304 (see FIG. 6), such as an O-ring. As indicated in FIG. 10, the gasket 304 is used to seal the heat sink 10 to a neighboring electronic device package 20. For the example configurations illustrated in FIGS. 6 and 7, the body 16 further defines an inlet distribution chamber 36 configured to supply the coolant to the inlet manifold(s) 30 and an outlet chamber 38 configured to receive the coolant from the outlet manifold(s) 32. The body 16 further defines an inlet plenum 40 configured to supply the coolant to the inlet chamber 36 and an outlet plenum 42 configured to receive the coolant from the outlet chamber 38. For the example configuration shown in FIG. 8, the inlet distribution chamber 36 and the inlet plenum 40 are arranged linearly, and the outlet chamber 38 and the outlet plenum 42 are arranged linearly. As used here, the term "linearly" should be understood to encompass orientations of the chambers 36, 38 relative to the respective plenum 40, 42 that are within plus or minus ten degrees (+/−10°) of one another.) FIG. 8 is an inverse model showing a linear arrangement for the chambers 36, 38 relative to the respective plenum 40, 42. However, only the end of outlet chamber 38 is shown in FIG. 8.

Figure 9:
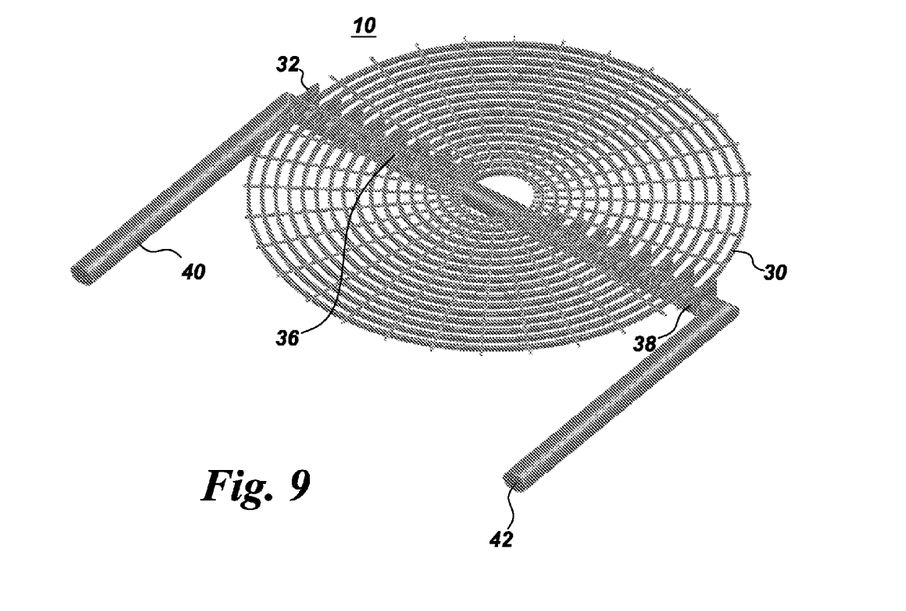
FIG. 9 is an inverse model of a heat sink with inlet distribution and outlet chambers that are arranged perpendicularly relative to the respective inlet and outlet plena.

Similarly, for the example configuration shown in FIG. 9, the inlet distribution chamber 36 and the inlet plenum 40 are arranged perpendicularly, and the outlet chamber 38 and the outlet plenum 42 are arranged perpendicularly. As used here, the term "perpendicularly" should be understood to encompass orientations of the chambers 36, 38 relative to the respective plenum 40, 42 that are within (90°+/−10°) of one another. FIG. 9 is an inverse model showing a perpendicular arrangement for the chambers 36, 38 relative to the respective plenum 40, 42. Beneficially, by placing the coolant inlet plenum 40 and outlet plenum 42 in the same face, the fluid connections are simplified. For example, this configuration may require four holes to be bored for the fluid delivery and removal, two of which are later plugged.

Figure 6:
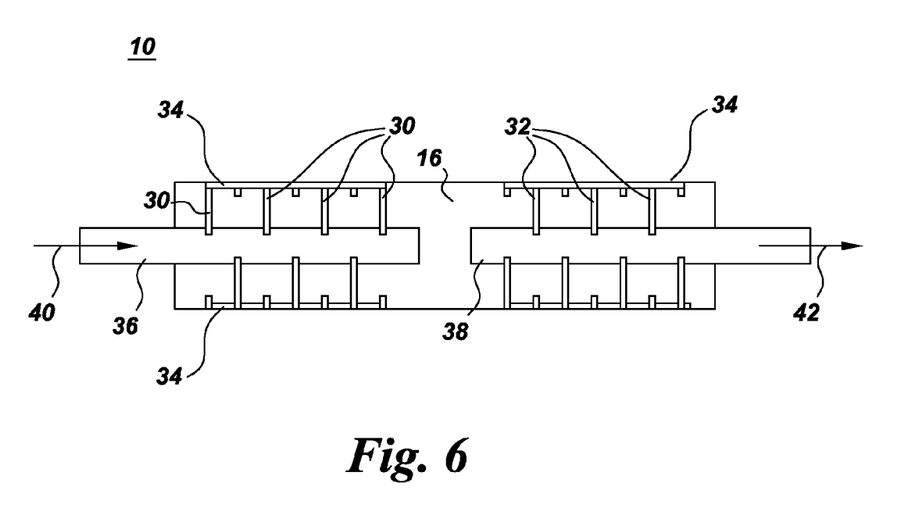
FIG. 6 is a cross-sectional view of a double sided heat sink.

In operation, the coolant is supplied to heat sink 10 via inlet plenum 40. The coolant then flows into the inlet distribution chamber 36, where it is distributed to the inlet manifold(s) 30, as indicated in FIGS. 6, 7 and 9. After passing through the millichannels 34 (see FIGS. 6, 7 and 9) to the outlet chamber 38, the coolant is exhausted from the outlet manifold(s) 32 to the outlet plenum 42, as indicated in FIGS. 6, and 7, for example.

Figure 4:
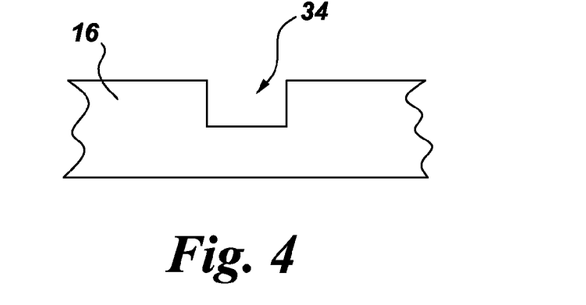
FIG. 4 shows an example cross-section of a radial millichannel for the heat sink of FIG. 2, 3 or 5.
Figure 5:
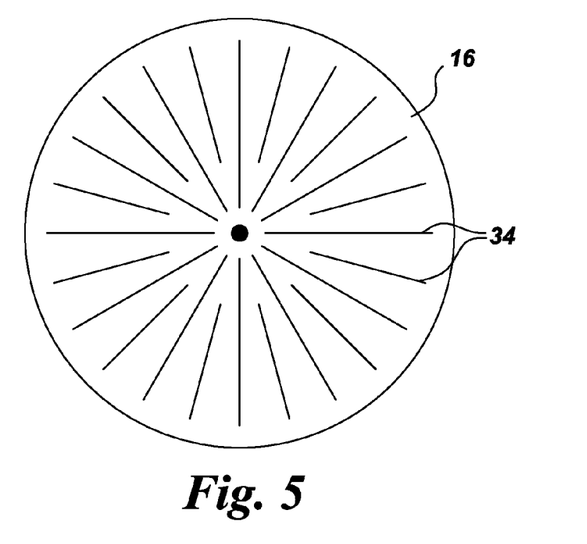
FIG. 5 illustrates a heat sink design which increases the number of radial millichannels.

FIG. 4 shows the cross-section of a radial millichannel 34. FIG. 5 illustrates a design to increase the number of radial channels to facilitate a reduction in pressure drop with a corresponding improvement in cooling efficiency. More particularly, for the example arrangement shown in FIG. 5, the number of radial millichannels is larger near the circumference of the cooling piece 10 relative to the number of radial millichannels near the center of the cooling piece 10. This arrangement permits the inclusion of additional radial millichannels for given spatial and machining constraints.

Beneficially, by incorporating the millichannels and inlet/outlet manifolds into a single cooling piece 16 as illustrated in FIGS. 2 and 3, for example, the assembly process is simplified. In particular, the use of a single cooling piece 16 eliminates the need to bond two components. Instead, heat sink 10 can be sealed to an adjacent device package 20 using a gasket 304 (see FIG. 10), such as an O-ring assembly, which provides a robust and simple seal between the adjacent components.

Figure 1:
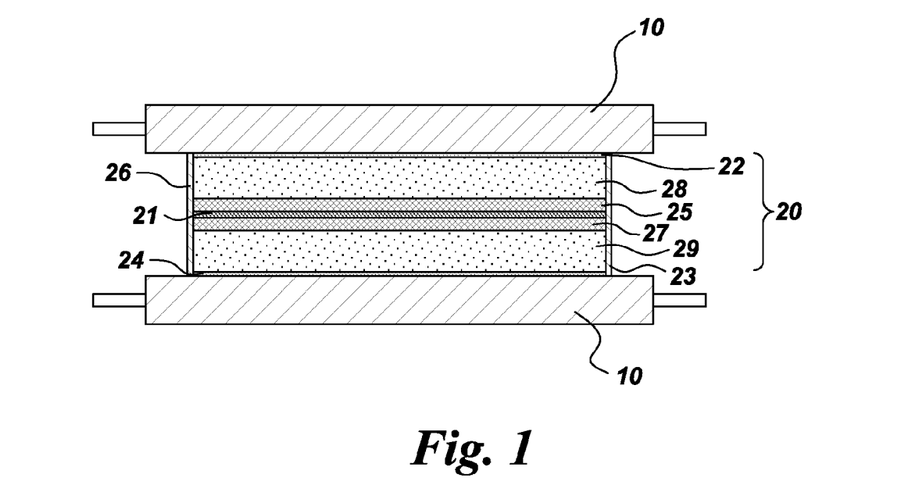
FIG. 1 depicts an electronic device package with upper and lower heatsinks.

For the exemplary embodiments described above with reference to FIGS. 1-10, the upper contact surface 22 and lower contact surface 24 can be circular in cross-section, and the body 16 can be cylindrical (i.e., a disk or hockey-puck arrangement). However, other geometries can be employed, including without limitation, square and rectangular cross-sections. For the example arrangement depicted in FIG. 1, the electronic device package 20 is a press-package 20. Although the invention is not limited to any specific device structure, the following example press-package configuration is provided for illustrative purposes. In the example, the press-package 20 comprises at least one semiconductor device 21 formed on a wafer 23, upper and lower coefficient of thermal-expansion (CTE) matched plates 25, 27, and upper and lower electrodes 28, 29. The wafer 23 is disposed between the CTE plates 25, 27, the upper electrode 28 is disposed above the upper CTE plate 25, and the lower CTE plate 27 is disposed above the lower electrode 29, as shown for example in FIG. 1. For the press-package embodiment, each of the wafer 23, CTE plates 25, 27 and electrodes 28, 29 may have a circular cross-section. Non-limiting examples of semiconductor devices include IGCTs, GTOs and IGBTs. The present invention finds application to semiconductor devices manufactured from a variety of semiconductors, non-limiting examples of which include silicon (Si), silicon carbide (SiC), gallium nitride (GaN), and gallium arsenide (GaAs). The press-package typically includes an insulating (for example, ceramic) housing 26, as indicated for example in FIG. 1. Although FIG. 1 shows the heat sinks 10 as extending outside the housing 26, in other embodiments, the bodies (cooling pieces) 16 of the heat sinks 10 are disposed within the housing 26. Moreover, electrodes 28, 29 can extend vertically beyond the bounds of housing 26, for example with a compliant seal disposed between the outer circumference of electrodes 28 (and 29) and the housing 26. In addition, the heat sinks 10 can extend out of the housing (as shown) to enable electrical connections and for placing other devices that need to be cooled. Therefore, the cooling piece 16 can have a larger diameter than housing 26.

It should be noted that the specific arrangement shown in FIG. 1 is merely illustrative, and any number of electronic device packages 20 and corresponding heat sinks 10 for cooling the electronic device packages may be incorporated into a given stack, depending on the specific application. One of the many benefits of the present invention is its flexibility and modularity for cooling a desired number of device packages.

In addition, the heat sink 10 can be single-sided or double-sided. For example, for the arrangement depicted in FIG. 7, the heat sink 10 is depicted as being one-sided, whereas the heat sink 10 shown in FIGS. 6 ands 10 is double-sided. A double-sided heat sink is configured for directly cooling multiple (in particular, two) electronic device packages 20, as shown for example in FIG. 10. As indicated in FIG. 6, for a double-sided heat sink 300, the cooling piece 16 has a first surface 2 and a second surface 4. A first subset of the millichannels 34, inlet manifolds 30 and outlet manifolds 32 are formed in the first surface 2 of the cooling piece 16, and a second subset of the millichannels 34, inlet manifolds 30 and outlet manifolds 32 are formed in the second surface 4 of the cooling piece 16. The first subset of millichannels 34 and inlet and outlet manifolds 30, 32 is configured to directly cool an upper contact surface 22 of one of the electronic device packages 20 by direct contact with the coolant. Similarly, the second subset of millichannels 34 and inlet and outlet manifolds 30, 32 is configured to directly cool a lower contact surface 24 of another of the electronic device packages 20 by direct contact with the coolant.

FIG. 6 depicts an offset arrangement of inlet and outlet manifolds for a double-sided heat sink. As indicated in FIG. 6, the spiral inlet manifold 30 in the first subset is offset from the spiral inlet manifold in the second set. Similarly, the spiral outlet manifold 32 in the first subset is offset from the spiral outlet manifold in the second set. More particularly, the spiral inlet manifold in the first subset is positioned opposite to the spiral outlet manifold in the second subset. Similarly, the spiral outlet manifold in the first subset is positioned opposite to the spiral inlet manifold in the second subset. This offset arrangement has several advantages. By positioning the spiral manifold carrying hot fluid (outlet manifolds) on a first cooling face opposite to the spiral manifold carrying cold fluid (inlet manifolds) on the other cooling face, better "heat spreading" in the manifolds is achieved as compared to the case of aligned inlet and outlet manifolds. In addition, the offset arrangement improves the velocity and pressure distribution of the coolant, all of which contribute to improved heat sink performance.

Beneficially, heat sinks 10 provide enhanced heat transfer relative to conventional cooling of power devices. Conventional heat sinks are not integral to the press-packages but rather are self-contained, in that the coolant does not contact the power devices but rather is encased within the heat sink. Thus, conventional heat sinks include cases, which are typically coupled to press-packages via thermal grease layers, which increase the thermal resistance. Thus, conventional heat-sinks contain additional thermal layers (the case), which impede heat transfer. In contrast, heat sinks 10 are disposed integral to the press-packages, directly cooling the power devices with direct contact by the coolant, thereby enhancing the heat transfer. Further, the interleaved spiral inlet and outlet manifolds deliver coolant uniformly to the surface of the device being cooled, and the millichannels increase the surface area of heat conduction from the power device to the coolant in this integral heat sink. For the embodiments illustrated in FIGS. 1-10, the heat sinks 10 are adapted for use with existing electronic packages 20, such as press-packages 20. Accordingly, heat sinks 10 can be used to integrally cool conventional press-pack power devices without modification of the device packages. Moreover, incorporating the milli-channels and inlet/outlet manifolds into a single cooling piece 16 simplifies the assembly process.

Although only certain features of the invention have been illustrated and described herein, many modifications and changes will occur to those skilled in the art. It is, therefore, to be understood that the appended claims are intended to cover all such modifications and changes as fall within the true spirit of the invention.

The invention claimed is:

1. A heat sink for directly cooling at least one electronic device package, the electronic device package having an upper contact surface and a lower contact surface, the heat sink comprising a cooling piece formed of at least one thermally conductive material, wherein the cooling piece defines:
   at least one inlet manifold configured to receive a coolant;
   at least one outlet manifold configured to exhaust the coolant, wherein the inlet and outlet manifolds are interleaved and are disposed in a spiral arrangement; and
   a plurality of millichannels disposed in a radial arrangement and configured to receive the coolant from the inlet manifold and to deliver the coolant to the outlet manifold, wherein the millichannels and inlet and outlet manifolds are further configured to directly cool one of the upper and lower contact surface of the electronic device package by direct contact with the coolant, such that the heat sink comprises an integral heat sink.

2. The heat sink of claim 1, wherein the thermally conductive material is selected from the group consisting of copper, aluminum, nickel, molybdenum, titanium, copper alloys, nickel alloys, molybdenum alloys, titanium alloys, aluminum silicon carbide (AlSiC), aluminum graphite and silicon nitride ceramic.

3. The heat sink of claim 1 for directly cooling a plurality of electronic device packages, wherein the cooling piece has a first surface and a second surface, wherein a first subset of the millichannels, inlet manifolds and outlet manifolds are formed in the first surface of the cooling piece, wherein a second subset of the millichannels, inlet manifolds and outlet manifolds are formed in the second surface of the cooling piece, wherein the first subset of millichannels and inlet and outlet manifolds is configured to directly cool an upper contact surface of one of the electronic device packages by direct contact with the coolant, and wherein the second subset of millichannels and inlet and outlet manifolds is configured to directly cool a lower contact surface of another of the electronic device packages by direct contact with the coolant.

4. The heat sink of claim 3, wherein the spiral inlet manifold in the first subset is offset from the spiral inlet manifold in the second set, and wherein the spiral outlet manifold in the first subset is offset from the spiral outlet manifold in the second set.

5. The heat sink of claim 1, wherein a cross-section of the millichannels and a cross-section of the inlet and outlet manifolds are selected from the group consisting of rounded, circular, trapezoidal, triangular, and rectangular cross sections.

6. The heat sink of claim 1, wherein the inlet and outlet manifolds and millichannels are configured to deliver the coolant uniformly to the respective one of the upper and lower contact surface of the electronic device package being cooled.

7. The heat sink of claim 1, wherein the cooling piece further defines a groove for receiving a gasket.

8. The heat sink of claim 7, wherein the gasket comprises an O-ring.

9. The heat sink of claim 1, wherein a number of radial millichannels is larger near a circumference of the cooling piece relative to a number of radial millichannels near a center of the cooling piece.

10. The heat sink of claim 1, wherein the body further defines:
   an inlet distribution chamber configured to supply the coolant to the inlet manifold;
   an outlet chamber configured to receive the coolant from the outlet manifold;
   an inlet plenum configured to supply the coolant to the inlet chamber; and
   an outlet plenum configured to receive the coolant from the outlet chamber.

11. The heat sink of claim 10, wherein the inlet distribution chamber and the inlet plenum are arranged linearly, and wherein the outlet chamber and the outlet plenum are arranged linearly.

12. The heat sink of claim 10, wherein the inlet distribution chamber and the inlet plenum are arranged perpendicularly, and wherein the outlet chamber and the outlet plenum are arranged perpendicularly.

* * * * *